United States Patent
Wang et al.

(10) Patent No.: US 10,332,782 B2
(45) Date of Patent: Jun. 25, 2019

(54) METHOD OF MANUFACTURING SILICON GERMANIUM-ON-INSULATOR

(71) Applicant: SunEdison Semiconductor Limited (UEN2013341164H), Singapore (SG)

(72) Inventors: Gang Wang, Grover, MO (US); Shawn George Thomas, Chesterfield, MO (US)

(73) Assignee: GlobalWafers Co., Ltd., Hsinchu (TW)

( * ) Notice: Subject to any disclaimer, the term of this patent is extended or adjusted under 35 U.S.C. 154(b) by 0 days.

(21) Appl. No.: 15/574,009

(22) PCT Filed: May 18, 2016

(86) PCT No.: PCT/US2016/033097
§ 371 (c)(1),
(2) Date: Nov. 14, 2017

(87) PCT Pub. No.: WO2016/196011
PCT Pub. Date: Dec. 8, 2016

(65) Prior Publication Data
US 2018/0294183 A1 Oct. 11, 2018

Related U.S. Application Data

(60) Provisional application No. 62/169,178, filed on Jun. 1, 2015.

(51) Int. Cl.
*H01L 21/762* (2006.01)
*H01L 21/02* (2006.01)
*H01L 21/3065* (2006.01)

(52) U.S. Cl.
CPC .... *H01L 21/76256* (2013.01); *H01L 21/0245* (2013.01); *H01L 21/0262* (2013.01);
(Continued)

(58) Field of Classification Search
CPC .......... H01L 21/76256; H01L 21/3065; H01L 21/02488; H01L 21/02502;
(Continued)

(56) References Cited

U.S. PATENT DOCUMENTS 4,755,865 A 7/1988 Wilson et al.
4,968,384 A 11/1990 Asano
(Continued)

FOREIGN PATENT DOCUMENTS

EP 0939430 A2 1/1999
EP 0926709 A2 6/1999
(Continued)

OTHER PUBLICATIONS

Gamble, H.S. et al., Low-loss CPW Lines on Surface Stabilized High-Resistivity Silicon, IEEE Microwave and Guided Wave Letters, Oct. 1999, pp. 395-397, vol. 9, No. 10.
(Continued)

*Primary Examiner* — William Coleman
(74) *Attorney, Agent, or Firm* — Armstrong Teasdale LLP

(57) ABSTRACT

The disclosed method is suitable for producing a SiGe-on-insulator structure. According to some embodiments of the method, a layer comprising SiGe is deposited on silicon-on-insulator substrate comprising an ultra-thin silicon top layer. In some embodiments, the layer comprising SiGe is deposited by epitaxial deposition. In some embodiments, the SiGe epitaxial layer is high quality since it is produced by engineering the strain relaxation at the Si/buried oxide interface. In some embodiments, the method accomplishes elastic strain relaxation of SiGe grown on a few monolayer thick Si layer that is weakly bonded to the underline oxide.

37 Claims, 4 Drawing Sheets

(52) U.S. Cl.
CPC .. *H01L 21/02488* (2013.01); *H01L 21/02499* (2013.01); *H01L 21/02502* (2013.01); *H01L 21/02532* (2013.01); *H01L 21/02658* (2013.01); *H01L 21/02694* (2013.01); *H01L 21/3065* (2013.01); *H01L 21/76251* (2013.01); *H01L 21/0242* (2013.01)

(58) Field of Classification Search
CPC ......... H01L 21/02694; H01L 21/02658; H01L 21/02532; H01L 21/0245
See application file for complete search history.

(56) References Cited

U.S. PATENT DOCUMENTS

| | | | |
|---|---|---|---|
| 5,189,500 A | 2/1993 | Kusunoki | |
| 5,773,355 A * | 6/1998 | Inoue | H01L 21/76251 |
| | | | 148/DIG. 12 |
| 6,043,138 A | 3/2000 | Ibok | |
| 6,373,113 B1 | 4/2002 | Gardner et al. | |
| 6,465,045 B1 | 10/2002 | Heuer et al. | |
| 6,562,127 B1 | 5/2003 | Kud et al. | |
| 6,624,047 B1 | 9/2003 | Sakaguchi et al. | |
| 7,459,374 B2 * | 12/2008 | Aulnette | H01L 21/76254 |
| | | | 257/E21.124 |
| 7,868,419 B1 | 1/2011 | Kerr et al. | |
| 7,879,699 B2 | 2/2011 | Schulze et al. | |
| 7,915,716 B2 | 3/2011 | Pisigan et al. | |
| 8,058,137 B1 | 11/2011 | Or-Bach et al. | |
| 8,076,750 B1 | 12/2011 | Kerr et al. | |
| 8,466,036 B2 | 6/2013 | Brindle et al. | |
| 8,481,405 B2 | 7/2013 | Arriagada et al. | |
| 8,796,116 B2 | 8/2014 | Grabbe et al. | |
| 8,846,493 B2 | 9/2014 | Libbert et al. | |
| 8,859,393 B2 | 10/2014 | Ries et al. | |
| 9,202,711 B2 | 12/2015 | Liu et al. | |
| 2002/0090758 A1 | 7/2002 | Henley et al. | |
| 2003/0013305 A1 | 1/2003 | Sugii et al. | |
| 2004/0002197 A1 | 1/2004 | Fathimulla et al. | |
| 2004/0005740 A1 | 1/2004 | Lochtefeld et al. | |
| 2004/0031979 A1 | 2/2004 | Lochtefeld et al. | |
| 2004/0108537 A1 | 6/2004 | Tiwari | |
| 2005/0054175 A1 | 3/2005 | Bauer | |
| 2005/0153524 A1 | 7/2005 | Maa et al. | |
| 2005/0167002 A1 | 8/2005 | Ghyselen et al. | |
| 2006/0030124 A1 | 2/2006 | Maa et al. | |
| 2006/0033110 A1 | 2/2006 | Alam et al. | |
| 2006/0226482 A1 | 10/2006 | Suvorov | |
| 2007/0032040 A1 | 2/2007 | Lederer | |
| 2007/0054466 A1 | 3/2007 | Hebras | |
| 2008/0153251 A1 | 6/2008 | Kostrzewa et al. | |
| 2009/0004833 A1 | 1/2009 | Suzuki et al. | |
| 2009/0014828 A1 | 1/2009 | Mizushima et al. | |
| 2009/0092810 A1 | 4/2009 | Lee et al. | |
| 2009/0321829 A1 | 12/2009 | Nguyen et al. | |
| 2011/0174362 A1 | 7/2011 | Tanner et al. | |
| 2011/0298083 A1 | 12/2011 | Yoneda | |
| 2012/0091587 A1 | 4/2012 | Or-Bach et al. | |
| 2012/0161310 A1 | 6/2012 | Brindle et al. | |
| 2012/0238070 A1 | 9/2012 | Libbert et al. | |
| 2012/0267681 A1 | 10/2012 | Nemoto et al. | |
| 2013/0120951 A1 | 5/2013 | Zuo et al. | |
| 2013/0122672 A1 | 5/2013 | Or-Bach et al. | |
| 2013/0168835 A1 | 7/2013 | Botula et al. | |
| 2013/0193445 A1 | 8/2013 | Dennard et al. | |
| 2013/0294038 A1 | 11/2013 | Landru et al. | |
| 2013/0344680 A1 | 12/2013 | Arriagada et al. | |
| 2014/0042598 A1 | 2/2014 | Kitada et al. | |
| 2014/0070215 A1 | 3/2014 | Bedell et al. | |
| 2014/0084290 A1 | 3/2014 | Allibert et al. | |
| 2014/0120654 A1 | 5/2014 | Fujii et al. | |
| 2014/0124902 A1 | 5/2014 | Botula et al. | |
| 2014/0273405 A1 | 9/2014 | Liu et al. | |
| 2015/0004778 A1 | 1/2015 | Botula et al. | |
| 2015/0115480 A1 | 4/2015 | Peidous et al. | |

FOREIGN PATENT DOCUMENTS

| | | |
|---|---|---|
| EP | 1081748 A2 | 3/2001 |
| EP | 1865551 A1 | 12/2007 |
| EP | 2426701 A1 | 7/2012 |
| EP | 2503592 A1 | 9/2012 |
| JP | H01315144 A | 12/1989 |
| JP | 2012253364 A | 12/2012 |
| WO | 2009120407 A2 | 10/2009 |
| WO | 2012127006 A1 | 9/2012 |

OTHER PUBLICATIONS

Lederer, D. et al., Enhanced High resistivity SOI wafers for RF Applications, 2004, IEEE International SOI Conference, Oct. 2004, pp. 46-47.

Lederer, D. et al., New Substrate Passivation Method Dedicated to HR SOI Wafer Fabrication With Increased Substrate Resistivity, IEEE Electron Device Letters, Nov. 2005, pp. 805-807, vol. 26, No. 11.

Lederer, D. et al., Performance of SOI devices transferred onto passivated HR SOI substrates using a layer transfer technique, 2006, IEEE International SOI Conference Proceedings, 2006, pp. 29-30.

Kerr, Daniel C., Identification of RF harmonic distortion of Si Substrates and its reduction using a trap-rich layer, IEEE (IEEE Topical Meeting), 2008, pp. 151-154.

Blicher, Adolph, Field-Effect and Bipolar Power Transistor Physics, Book, 1981, pp. 61-64, Academic Press, Inc.

Morkc, Hadis, Nanoheteroepitaxy and nano-ELO; Handbook of Nitride Semiconductors and Devices, Materials Properties, Physics, and Growth, 2009, Wiley, pp. 564-569, vol. 1, Chapter 3.5.5.3.

Zamir, S. et al., Reduction of cracks in GaN films on Si-on-insulator by lateral confined epitaxy, Jounral of Crystal Growth, Elsevier Amsterdam, NL, Sep. 2002, pp. 375-380, vol. 243, No. 3-4.

Gao, Min, et al., A transmission electron microscopy study of microstructural defects in proton implated silicon, Journal of Allied Physics, Oct. 15, 1996 American Ibstitute of Physics, pp. 4767-4769, vol. 70, No. 8.

Gao, Min, et al., Two-dimensional network of dislocations and nanocavities in hydrogen-implanted and two-step annealed silicon, Applied Physics Letters, American Institute of Physics, May 18, 1998, pp. 2544-2546, vol. 72, No. 20.

Brunner, K. et al., Molecular beam epitaxy growth and thermal stability of $Si_{1-x}Ge_x$ layers on extremely thin silicon-on-insulator substrates, thin solid films, 1998, pp. 245-250, Elsevier Science S.A.

International Search Report and Written Opinion of the International Searching Authority regarding PCT/US2016/033097 dated Aug. 2, 2016, pp. 1-13.

* cited by examiner

METHOD OF MANUFACTURING SILICON GERMANIUM-ON-INSULATOR

CROSS-REFERENCE TO RELATED APPLICATION

This application is a National Stage application of International Application No. PCT/US2016/033097, filed on May 18, 2017. International Application No. PCT/US2016/033097 claims priority to U.S. Provisional patent application Ser. No. 62/169,178 filed on Jun. 1, 2015. The disclosure of which is hereby incorporated by reference in its entirety.

THE FIELD OF THE INVENTION

The present invention generally relates to the field of semiconductor wafer manufacture. More specifically, the present invention relates to a method for forming a semiconductor-on-insulator structure.

BACKGROUND OF THE INVENTION

Semiconductor wafers are generally prepared from a single crystal ingot (e.g., a silicon ingot) which is trimmed and ground to have one or more flats or notches for proper orientation of the wafer in subsequent procedures. The ingot is then sliced into individual wafers. While reference will be made herein to semiconductor wafers constructed from silicon, other materials may be used to prepare semiconductor wafers, such as germanium, silicon carbide, silicon germanium, gallium arsenide, and other alloys of Group III and Group V elements, such as gallium nitride or indium phosphide, or alloys of Group II and Group VI elements, such as cadmium sulfide or zinc oxide.

Semiconductor wafers (e.g., silicon wafers) may be utilized in the preparation of composite layer structures. A composite layer structure (e.g., a semiconductor-on-insulator, and more specifically, a silicon-on-insulator (SOI) structure) generally comprises a handle wafer or layer, a device layer, and an insulating (i.e., dielectric) film (typically an oxide layer) between the handle layer and the device layer. Generally, the device layer is between 0.01 and 20 micrometers thick, such as between 0.05 and 20 micrometers thick. Thick film device layers may have a device layer thickness between about 1.5 micrometers and about 20 micrometers. Thin film device layers may have a thickness between about 0.01 micrometer and about 0.20 micrometer. In general, composite layer structures, such as silicon-on-insulator (SOI), silicon-on-sapphire (SOS), and silicon-on-quartz, are produced by placing two wafers in intimate contact, thereby initiating bonding by van der Waal's forces, followed by a thermal treatment to strengthen the bond. The anneal may convert the terminal silanol groups to siloxane bonds between the two interfaces, thereby strengthening the bond.

After thermal anneal, the bonded structure undergoes further processing to remove a substantial portion of the donor wafer to achieve layer transfer. For example, wafer thinning techniques, e.g., etching or grinding, may be used, often referred to as back etch SOI (i.e., BESOI), wherein a silicon wafer is bound to the handle wafer and then slowly etched away until only a thin layer of silicon on the handle wafer remains. See, e.g., U.S. Pat. No. 5,189,500, the disclosure of which is incorporated herein by reference as if set forth in its entirety. This method is time-consuming and costly, wastes one of the substrates and generally does not have suitable thickness uniformity for layers thinner than a few microns.

Another common method of achieving layer transfer utilizes a hydrogen implant followed by thermally induced layer splitting. Particles (atoms or ionized atoms, e.g., hydrogen atoms or a combination of hydrogen and helium atoms) are implanted at a specified depth beneath the front surface of the donor wafer. The implanted particles form a cleave plane in the donor wafer at the specified depth at which they were implanted. The surface of the donor wafer is cleaned to remove organic compounds or other contaminants, such as boron compounds, deposited on the wafer during the implantation process.

The front surface of the donor wafer is then bonded to a handle wafer to form a bonded wafer through a hydrophilic bonding process. Prior to bonding, the donor wafer and/or handle wafer are activated by exposing the surfaces of the wafers to plasma containing, for example, oxygen or nitrogen. Exposure to the plasma modifies the structure of the surfaces in a process often referred to as surface activation, which activation process renders the surfaces of one or both of the donor water and handle wafer hydrophilic. The surfaces of the wafers can be additionally chemically activated by a wet treatment, such as an SC1 clean or hydrofluoric acid. The wet treatment and the plasma activation may occur in either order, or the wafers may be subjected to only one treatment. The wafers are then pressed together, and a bond is formed there between. This bond is relatively weak, due to van der Waal's forces, and must be strengthened before further processing can occur.

In some processes, the hydrophilic bond between the donor wafer and handle wafer (i.e., a bonded wafer) is strengthened by heating or annealing the bonded wafer pair. In some processes, wafer bonding may occur at low temperatures, such as between approximately 300° C. and 500° C. The elevated temperatures cause the formation of covalent bonds between the adjoining surfaces of the donor wafer and the handle wafer, thus solidifying the bond between the donor wafer and the handle wafer. Concurrently with the heating or annealing of the bonded wafer, the particles earlier implanted in the donor wafer weaken the cleave plane.

A portion of the donor wafer is then separated (i.e., cleaved) along the cleave plane from the bonded wafer to form the SOI wafer. Cleaving may be carried out by placing the bonded wafer in a fixture in which mechanical force is applied perpendicular to the opposing sides of the bonded wafer in order to pull a portion of the donor wafer apart from the bonded wafer. According to some methods, suction cups are utilized to apply the mechanical force. The separation of the portion of the donor wafer is initiated by applying a mechanical wedge at the edge of the bonded wafer at the cleave plane in order to initiate propagation of a crack along the cleave plane. The mechanical force applied by the suction cups then pulls the portion of the donor wafer from the bonded wafer, thus forming an SOI wafer.

According to other methods, the bonded pair may instead be subjected to an elevated temperature over a period of time to separate the portion of the donor wafer from the bonded wafer. Exposure to the elevated temperature causes initiation and propagation of cracks along the cleave plane, thus separating a portion of the donor wafer. The crack forms due to the formation of voids from the implanted ions, which grow by Ostwald ripening. The voids are filled with hydrogen and helium. The voids become platelets. The pressurized gases in the platelets propagate micro-cavities and microcracks, which weaken the silicon on the implant plane. If the anneal is stopped at the proper time, the weakened bonded wafer may be cleaved by a mechanical process. However, if the thermal treatment is continued for a longer duration and/or at a higher temperature, the micro-crack propagation reaches the level where all cracks merge along the cleave plane, thus separating a portion of the donor wafer. This method allows for better uniformity of the transferred layer and allows recycle of the donor wafer, but typically requires heating the implanted and bonded pair to temperatures approaching 500° C.

Ultra-thin silicon-on-insulator (UTSOI) substrates have been used as the platform for low power high-performance complementary metal-oxide-semiconductor (CMOS) devices. See S. Deleonibus, et. al., "Future Challenges and Opportunities for Heterogeneous Process Technology, Towards the Thin Films, Zero Intrinsic Variability Devices, Zero Power Era," in *IEDM*, San Francisco, 2014. UTSOI provide significant advantages compared to bulk silicon CMOS technology. For details, see Q. Liu, "FDSOI CMOS Devices Featuring Dual Strained Channel and Thin BOX Extendable to the 10 nm Node," in *IEDM*, San Francisco, 2014. These advantages of UTSOI include: 1) the fully depleted channel provides immunity to short channel effect; 2) the ultra-thin Si body isolated by the thin BOX (25 nm) forms natural shallow junctions and minimizes the junction capacitance; and 3) the thin BOX enhances electrostatic control through back gate bias from the substrate. Despite the advantages, the performance of devices built on UTSOI is still limited by the Si carrier mobility. High-mobility channel materials, like SiGe, provide an additional device performance booster. See G. Hellings, et. al., "Implant-Free SiGe Quantum Well pFET: A novel, highly scalable and low thermal budget device, featuring raised source/drain and high-mobility channel," in *IEDM*, San Francisco, 2010; and S. Krishnan, "A manufacturable dual channel (Si and SiGe) high-k metal gate CMOS technology with multiple oxides for high performance and low power applications," in *IEDM*, Washington D.C., 2011. To extend the benefit of UTSOI, ultra-thin SiGe-on-Insulator (UTSGOI) substrates are of great interest. However, unlike the cheap and readily available silicon wafers, silicon germanium is conventionally epitaxially grown on silicon substrates. The lattice mismatch between silicon germanium and silicon leads to high threading dislocation densities (>$10^8$ cm$^{-2}$) and rough surface ($R_{ms}$>2 nm). See M. L. Lee, "Strained Si, SiGe, and Ge channels for high-mobility metal-oxide-semiconductor field-effect transistors," *J. Appl. Phys.*, vol. 97, p. 011101, 2005. SGOI is usually obtained by smart-cut technology and the transferred silicon germanium layer has the same defect density as an epitaxially prepared silicon germanium layer. See Z. Y. CHeng, "SiGe-On-Insulator (SGOI): substrate preparation and MOSFET fabrication for electron mobility evaluation," in *SOI Conf.*, Durango, Colo., USA, 2001. In addition, the transferred silicon germanium layer needs additional processing to achieve the required thickness and to smooth the surface. Layer thinning is normally done by chemical mechanical polishing (CMP) that utilizes both mechanical polishing and chemical etching. See Z. Cheng, et. al., "Electron Mobility Enhancement in Strained-Si n-MOSFETs Fabricated on SiGe-on-Insulator (SGOI) Substrates," *IEEE Elect. Dev. Lett.*, vol. 22, no. 7, p. 321, 2001. Silicon germanium is much more susceptible to chemicals commonly used in silicon wafer manufacture, so that processing silicon germanium is more challenging, especially when controlling the thickness of layer on the order of angstroms.

SUMMARY OF THE INVENTION

Briefly, the present invention is directed to a method of preparing a multilayer structure. The method comprises etching a silicon layer of a silicon-on-insulator substrate, wherein the silicon-on-insulator substrate comprises (i) a single crystal semiconductor handle layer comprising two major, generally parallel surfaces, one of which is a front surface of the single crystal semiconductor handle layer and the other of which is a back surface of the single crystal semiconductor handle layer, a circumferential edge joining the front and back surfaces of the single crystal semiconductor handle layer, a central plane between and parallel to the front surface and the back surface of the single crystal semiconductor handle layer, a central axis perpendicular to the central plane, and a bulk region between the front and back surfaces of the single crystal semiconductor handle layer, (ii) a dielectric layer in interfacial contact with the front surface of the single crystal semiconductor handle layer, and (ii) the silicon layer in interfacial contact with the dielectric layer, and further wherein the silicon layer is etched to a thickness between about 0.5 nanometer and about 4 nanometers, as measured along the central axis; depositing a first layer comprising germanium on the etched silicon layer; annealing the silicon-on-insulator substrate comprising the etched silicon layer and the first layer comprising germanium at a temperature and duration sufficient to interdiffuse germanium from the first layer into the etched silicon layer, to thereby yield a second layer comprising silicon and germanium having a formula of $Si_xGe_{1-x}$, wherein x is between about 0.2 and about 0.8, molar ratio; and depositing a third layer comprising silicon and germanium by epitaxial deposition on the second layer comprising silicon and germanium, wherein the third layer comprising silicon and germanium has a formula $Si_yGe_{1-y}$, wherein y is between about 0 and about 0.9, molar ratio.

The present invention is further directed to a method of preparing a multilayer structure. The method comprises: etching a silicon layer of a silicon-on-insulator substrate, wherein the silicon-on-insulator substrate comprises (i) a single crystal semiconductor handle layer comprising two major, generally parallel surfaces, one of which is a front surface of the single crystal semiconductor handle layer and the other of which is a back surface of the single crystal semiconductor handle layer, a circumferential edge joining the front and back surfaces of the single crystal semiconductor handle layer, a central plane between and parallel to the front surface and the back surface of the single crystal semiconductor handle layer, a central axis perpendicular to the central plane, and a bulk region between the front and back surfaces of the single crystal semiconductor handle layer, (ii) a dielectric layer in interfacial contact with the front surface of the single crystal semiconductor handle layer, and (ii) the silicon layer in interfacial contact with the dielectric layer, and further wherein the silicon layer is etched to a thickness between about 0.5 nanometer and about 4 nanometers, as measured along the central axis; depositing boron on the etched silicon layer at a temperature and for a duration sufficient to cause boron atoms to diffuse to the interface between the dielectric layer and the silicon layer; and depositing a layer comprising silicon and germanium by epitaxial deposition on the etched silicon layer.

Other objects and features of this invention will be in part apparent and in part pointed out hereinafter.

DETAILED DESCRIPTION OF THE EMBODIMENT(S) OF THE INVENTION

Figure 1:
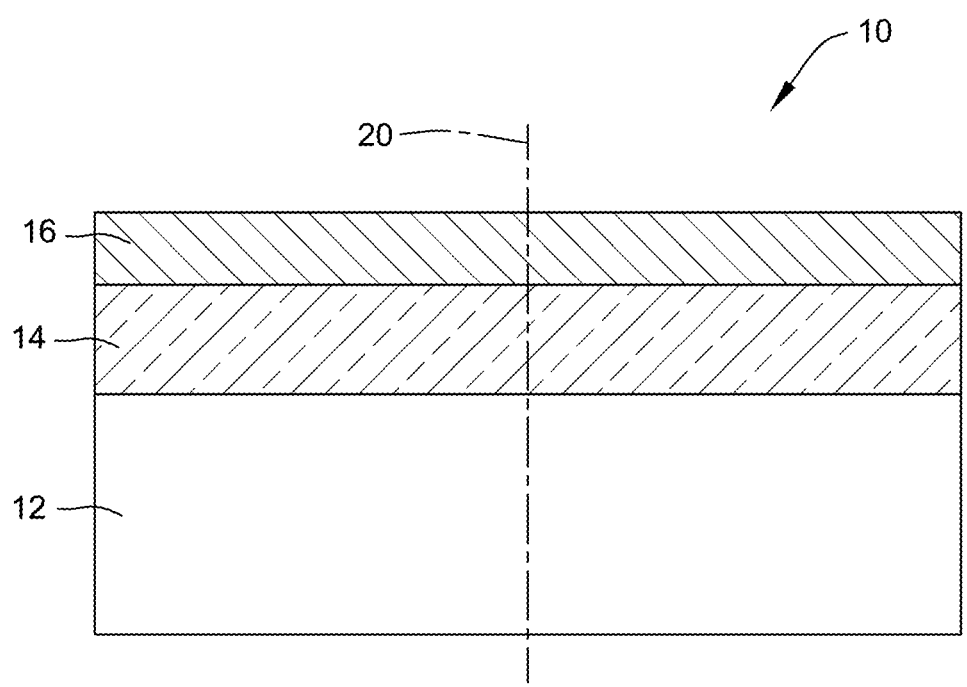
FIG. 1 is a depiction of a semiconductor-on-insulator (SOI, e.g., silicon-on-insulator) structure according to some embodiments of the present invention.

According to the present invention, a method is provided for producing a semiconductor-on-insulator structure. The semiconductor-on-insulator structure comprises a device layer comprising silicon germanium. In some embodiments, a layer comprising silicon germanium is deposited on a silicon-on-insulator substrate comprising an ultra-thin silicon top layer, e.g., an ultra-thin silicon device layer. In some embodiments, the layer comprising silicon germanium is deposited by epitaxial deposition. In some embodiments, the silicon germanium epitaxial layer is high quality since it is produced by engineering the strain relaxation at the interface between the ultra-thin silicon device layer and the dielectric layer, e.g. a buried oxide layer. In some embodiments, the method accomplishes elastic strain relaxation of silicon germanium grown on a few monolayer thick top silicon device layer that is weakly bonded to the underlying dielectric layer.

In some embodiments, the first step of the method of the present invention is to prepare a semiconductor-on-insulator substrate (SOI, e.g., silicon-on-insulator substrate) comprising an ultra-thin semiconductor (e.g., silicon) top layer. The semiconductor (e.g., silicon) top layer of an SOI substrate may be etched in-situ down to a thickness, for example, on the order of about 0.5 nm to about 4 nanometers, such as about 1 nanometer, in an epitaxial reactor. At these thicknesses, the semiconductor (e.g., silicon) lattice is relaxed compared to bulk substrates. In some embodiments, in a second step of the method of the present invention, the SOI substrate comprising the ultra-thin semiconductor (e.g., silicon) top layer is exposed to an ambient atmosphere comprising a source of germanium, such as a volatile source of germanium, e.g., $GeH_4$, to promote intermixing of germanium and silicon. In some embodiments, exposure to the source of germanium first results in the deposition of a thin Ge layer. The germanium in the thin layer may interdiffuse into the ultra-thin semiconductor (e.g., silicon) top layer, thereby yielding, when silicon is the device layer material, a layer comprising $Si_{1-x}Ge_x$ wherein x has a value between about 0.2 and about 0.8. During the annealing step, silicon atoms diffuse to the top surface to minimize the surface energy while germanium atoms diffuse to the bottom of the layer to minimize the system elastic energy. The intermixing process is driven by the chemical potential gradient of germanium atoms.

In some embodiments, an alternative approach is to mechanically loosen the silicon back bonds by introducing Boron atoms at the interface between the ultra-thin silicon device layer and the dielectric layer, e.g. a buried oxide layer. The trapped Boron atoms are bonded to the trapped H atoms, which weakens the bonding between, e.g., silicon and oxygen at the interface between the ultra-thin silicon device layer and the dielectric layer.

In some embodiments, an alternative approach is to deposit a surfactant atom selected from the group consisting of arsenic, antimony, tellurium, and any combination thereof. The surfactant atoms tend to migrate to the growth front and suppress surface diffusion, which enables the growth of a thicker strained Ge layer (>1 nm). The strain energy associated with the thicker strained Ge promotes interdiffusion between silicon and germanium, thereby enhancing the uniformity of the SiGe layer.

In some embodiments, a layer of silicon germanium is deposited to complete the SiGe-on-insulator structure. The silicon germanium layer may have the formula $Si_yGe_{1-y}$, wherein y is between about 0 and about 0.9, molar ratio, or between about 0.2 and about 0.4, molar ratio or between about 0.3 and about 0.9, molar ratio and have a thickness, for example, between about 2 nanometers and about 5000 nanometers, or between about 2 nanometers and about 500 nanometers, such as between about 4 nanometers and about 40 nanometers.

The potential advantages of this approach over conventional smart-cut technique include the following. The method of the present invention advantageously deposits a silicon germanium layer with reduced or eliminated threading dislocations. The disclosed method relaxes the elastic strain before it reaches the critical value for threading dislocation generation via atom intermixing. This strain relaxation technique may be limited to the case of a few monolayer thick as the critical thickness of epitaxially deposited germanium layer on a bulk silicon substrate is on the order of about 1 nanometer. Substantial interdiffusion may occur at the Si/Ge interface. Accordingly, the process of the present invention produces a thin silicon top layer, on the order of about 1 nanometer, in order to facilitate interdiffusion and the resulting silicon germanium layer. Moreover, the method of the present invention presents a simplified process flow compared to the conventional SiGe layer transfer. By making use of the relatively mature UTSOI technology, only one extra epitaxy step is required to convert the UTSOI into ultra-thin silicon germanium on insulator (UTSGOI) or silicon germanium on insulator (SGOI) substrates. In some embodiments, both the top silicon layer thinning and the subsequent growth of silicon germanium are realized in the same epi reactor in one process step.

I. Substrates

Substrates for use in the method of the present invention comprise a semiconductor-on-insulator (SOI, e.g., silicon-on-insulator) structure. The SOI substrate may be prepared by conventional means. With reference to FIG. 1, a semiconductor-on-insulator (SOI, e.g., silicon-on-insulator) structure 10 may comprise, without limitation, a single crystal semiconductor handle layer 12 (e.g., a single crystal silicon handle layer), a dielectric layer 14, a single crystal semiconductor device layer 16 (e.g., a single crystal silicon device layer).

An SOI substrate 10 comprises a semiconductor handle layer 12, e.g., a layer derived from single crystal semiconductor handle wafer, and a semiconductor device layer 16, e.g., a layer derived from a single crystal semiconductor donor wafer. The semiconductor device layer 16 may be transferred onto the semiconductor handle layer 12 by wafer thinning techniques such as etching a semiconductor donor substrate or by cleaving a semiconductor donor substrate comprising a damage plane. In general, the single crystal semiconductor handle wafer and single crystal semiconductor donor wafer comprise two major, generally parallel surfaces. One of the parallel surfaces is a front surface of the wafer, and the other parallel surface is a back surface of the wafer. The wafers comprise a circumferential edge joining the front and back surfaces, a bulk region between the front and back surfaces, and a central plane between the front and back surfaces. The wafers additionally comprise an imaginary central axis perpendicular to the central plane and a radial length that extends from the central axis to the circumferential edge. In addition, because semiconductor wafers, e.g., silicon wafers, typically have some total thickness variation (TTV), warp, and bow, the midpoint between every point on the front surface and every point on the back surface may not precisely fall within a plane. As a practical matter, however, the TTV, warp, and bow are typically so slight that to a close approximation the midpoints can be said to fall within an imaginary central plane which is approximately equidistant between the front and back surfaces.

Prior to any operation suitable for the manufacture of an SOI substrate 10, the front surface and the back surface of a handle wafer and or a donor wafer may be substantially identical. A surface is referred to as a "front surface" or a "back surface" merely for convenience and generally to distinguish the surface upon which the operations of method of the present invention are performed. In the context of the present invention, a "front surface" of a single crystal semiconductor handle wafer, e.g., a single crystal silicon handle wafer, refers to the major surface of the substrate that becomes an interior surface of the SOI substrate 10. A "back surface" of a single crystal semiconductor handle wafer refers to the major surface that becomes an exterior surface of the semiconductor-on-insulator composite structure 10. Similarly, a "front surface" of a single crystal semiconductor donor wafer, e.g., a single crystal silicon donor wafer, refers to the major surface of the single crystal semiconductor donor wafer that becomes an interior surface of the semiconductor-on-insulator composite structure 10. The front surface of a single crystal semiconductor donor wafer often comprises a dielectric layer 14, e.g., a silicon dioxide layer, which forms the buried oxide (BOX) layer in the final structure. A "back surface" of a single crystal semiconductor donor wafer, e.g., a single crystal silicon donor wafer, refers to the major surface that becomes an exterior surface of the semiconductor-on-insulator composite structure 10. Upon completion of conventional bonding and wafer thinning steps, the single crystal semiconductor donor wafer forms the semiconductor device layer 16 of the semiconductor-on-insulator (e.g., silicon-on-insulator) composite structure 10.

The single crystal semiconductor wafers, e.g., the single crystal silicon handle wafer and single crystal silicon donor wafer, of the present invention typically have a nominal diameter of at least about 150 mm, at least about 200 mm, at least about 300 mm, or at least about 450 mm. Wafer thicknesses may vary from about 250 micrometers to about 1500 micrometers, such as between about 300 micrometers and about 1000 micrometers, suitably within the range of about 500 micrometers to about 1000 micrometers. In some specific embodiments, the wafer thickness may be about 725 micrometers.

The semiconductor handle wafer 12 and the device layer 16 may comprise single crystal semiconductor material. In some embodiments, the semiconductor material may be selected from the group consisting of silicon, silicon carbide, sapphire, aluminum nitride, silicon germanium, gallium arsenide, gallium nitride, indium phosphide, indium gallium arsenide, germanium, and combinations thereof. The semiconductor handle wafer 12 and the device layer 16 may comprise the same semiconductor material, or they may be different. In view thereof, semiconductor-on-insulator substrates 10 may comprise, e.g., silicon-on-insulator, sapphire-on-insulator, aluminum nitride-on-insulator, and other combinations.

In particularly preferred embodiments, the single crystal semiconductor wafers comprise single crystal silicon wafers which have been sliced from a single crystal ingot grown in accordance with conventional Czochralski crystal growing methods or float zone growing methods. Such methods, as well as standard silicon slicing, lapping, etching, and polishing techniques are disclosed, for example, in F. Shimura, Semiconductor Silicon Crystal Technology, Academic Press, 1989, and Silicon Chemical Etching, (J. Grabmaier ed.) Springer-Verlag, N.Y., 1982 (incorporated herein by reference). Preferably, the wafers are polished and cleaned by standard methods known to those skilled in the art. See, for example, W. C. O'Mara et al., *Handbook of Semiconductor Silicon Technology*, Noyes Publications. If desired, the wafers can be cleaned, for example, in a standard SC1/SC2 solution. In some embodiments, the single crystal silicon wafers of the present invention are single crystal silicon wafers which have been sliced from a single crystal ingot grown in accordance with conventional Czochralski ("Cz") crystal growing methods, typically having a nominal diameter of at least about 150 mm, at least about 200 mm, at least about 300 mm, or at least about 450 mm. Preferably, both the single crystal silicon handle wafer and the single crystal silicon donor wafer have mirror-polished front surface finishes that are free from surface defects, such as scratches, large particles, etc. Wafer thickness may vary from about 250 micrometers to about 1500 micrometers, such as between about 300 micrometers and about 1000 micrometers, suitably within the range of about 500 micrometers to about 1000 micrometers. In some specific embodiments, the wafer thickness may be about 725 micrometers.

In some embodiments, the single crystal semiconductor handle wafer and the single crystal semiconductor donor wafer comprise interstitial oxygen in concentrations that are generally achieved by the Czochralski-growth method. In some embodiments, the semiconductor wafers comprise oxygen in a concentration between about 4 PPMA and about 18 PPMA. In some embodiments, the semiconductor wafers comprise oxygen in a concentration between about 10 PPMA and about 35 PPMA. Preferably, the single crystal silicon handle wafer comprises oxygen in a concentration of no greater than about 10 ppma. Interstitial oxygen may be measured according to SEMI MF 1188-1105.

In general, there are no constraints on the resistivity of the handle wafer and/or device layer of the SOI substrate. Accordingly, the resistivity of the handle wafer and/or device layer is based on the requirements of the end use/application of the structure of the present invention. The resistivity may therefore vary from milliohm or less to megaohm or more. In some embodiments, the single crystal semiconductor handle wafer 12 comprises a p-type or an n-type dopant. Suitable dopants include boron (p type), gallium (p type), phosphorus (n type), antimony (n type), and arsenic (n type). The dopant concentration is selected based on the desired resistivity of the handle wafer. In some embodiments, the single crystal semiconductor handle substrate comprises a p-type dopant. In some embodiments, the single crystal semiconductor handle substrate is a single crystal silicon wafer comprising a p-type dopant, such as boron.

In some embodiments, the handle wafer and/or device layer has a relatively low minimum bulk resistivity, such as below about 100 ohm-cm, below about 50 ohm-cm, below about 1 ohm-cm, below about 0.1 ohm-cm, or even below about 0.01 ohm-cm. In some embodiments, the handle wafer and/or device layer has a relatively low minimum bulk resistivity, such as below about 100 ohm-cm, or between about 1 ohm-cm and about 100 ohm-cm. Low resistivity wafers may comprise electrically active dopants, such as boron (p type), gallium (p type), phosphorus (n type), antimony (n type), and arsenic (n type).

In some embodiments, the handle wafer and/or device layer has a relatively high minimum bulk resistivity. High resistivity wafers are generally sliced from single crystal ingots grown by the Czochralski method or float zone method. High resistivity wafers may comprise electrically active dopants, such as boron (p type), gallium (p type), aluminum (p type), indium (p type), phosphorus (n type), antimony (n type), and arsenic (n type), in generally very low concentrations. Cz-grown silicon wafers may be subjected to a thermal anneal at a temperature ranging from about 600° C. to about 1000° C. in order to annihilate thermal donors caused by oxygen that are incorporated during crystal growth. In some embodiments, the single crystal semiconductor handle wafer has a minimum bulk resistivity of at least 100 Ohm-cm, at least about 500 Ohm-cm, at least about 1000 Ohm-cm, or even at least about 3000 Ohm-cm, such as between about 100 Ohm-cm and about 100,000 Ohm-cm, or between about 500 Ohm-cm and about 100,000 Ohm-cm, or between about 1000 Ohm-cm and about 100,000 Ohm-cm, or between about 500 Ohm-cm and about 10,000 Ohm-cm, or between about 750 Ohm-cm and about 10,000 Ohm-cm, between about 1000 Ohm-cm and about 10,000 Ohm-cm, between about 2000 Ohm-cm and about 10,000 Ohm-cm, between about 3000 Ohm-cm and about 10,000 Ohm-cm, or between about 3000 Ohm cm and about 5,000 Ohm-cm. In some embodiments, the high resistivity single crystal semiconductor handle substrate may comprise a p type dopant, such as boron, gallium, aluminum, or indium. In some embodiments, the high resistivity single crystal semiconductor handle substrate may comprise a n type dopant, such as phosphorus, antimony, or arsenic. Methods for preparing high resistivity wafers are known in the art, and such high resistivity wafers may be obtained from commercial suppliers, such as SunEdison Semiconductor Ltd. (St. Peters, Mo.; formerly MEMC Electronic Materials, Inc.).

The semiconductor device layer 16 may comprise a single crystal silicon layer. The semiconductor device layer 16 may have any of (100), (110), or (111) crystal orientation, and the choice of crystal orientation may be dictated by the end use of the structure. Structures prepared according to the method of the present invention are particularly suitable for use as CMOS devices. Accordingly, the (100) crystal orientation is preferred for the single crystal silicon device layer. In some embodiments, the final silicon germanium-on-insulator structure of the present invention may be useful for the integration of III-V compound semiconductors (e.g., InGaAs, InP, GaN, and so on) on a silicon platform. These structures enable on-chip optical interconnect and integration of power devices and RF devices with CMOS devices. Such structures may preferably comprise the (111) crystal orientation. Finally, a substrate comprising a silicon device layer having the (110) crystal orientation would give enhanced carrier mobility of CMOS devices. In any other respect, the device layer 16 may have substantially similar characteristics, e.g., resistivity, oxygen content, etc., as the handle layer 12 as described above.

With reference to FIG. 1, the SOI substrate 10 comprises a central axis 20. The central axis 20 is specifically delineated in FIG. 1 since the "thickness" of the various layers of the substrate 10 and layers subsequently added according to the method of the present invention are measured along this central axis 20.

II. Etching the Device Layer

According to the method of the present invention, the device layer 16 may be subjected to a thinning process to thereby thin the device layer 16 to a thickness between about 0.5 nanometer and about 4 nanometers, as measured along the central axis 20. See FIG. 2, which depicts an SOI substrate 10 comprising a thinned device layer 22. In some embodiments, the thinned device layer 22 has a thickness between about 0.5 nanometer and about 2 nanometers, as measured along the central axis, such as between about 1 nanometer and about 2 nanometers, as measured along the central axis. Any suitable thinning technique may be employed. In some embodiments, the device layer 16 is thinned to thereby yield a thinned device layer 22 by etching. In some embodiments, the device layer 16 is thinned to thereby yield a thinned device layer 22 by vapor phase etching in an epitaxial reactor chamber.

In some embodiments, the device layer 16 is thinned to thereby yield a thinned device layer 22 by vapor phase etching. The vapor phase etching may occur in an epitaxial reaction chamber suitable for carrying out the other steps of the disclosed method. A suitable epitaxial reaction chamber may include the Epsilon E2000®, Epsilon E3200® system from ASM Or Centura® from Applied Materials. The device layer may be thinned by a gaseous hydrogen chloride vapor or chloride vapor phase etch to the desired thickness. The chamber ambient atmosphere may additionally comprise a carrier gas, which may be inert or it may be a reducing atmosphere. Suitable carrier gases include hydrogen, argon, helium, nitrogen, or any combination thereof. The carrier gas both delivers the etching gas and removes etching byproducts, such as $Si_xH_yCl_{1-x-y}$. A preferred carrier gas is hydrogen. In some embodiments, the silicon layer is etched at an initial temperature of about 800° C. or more, and the etching temperature is decreased to less than 600° C., such as about 500° C. during or at the end of the silicon layer etching step with a ramp rate that may be between about 5° C./s and about 20° C./s. The purpose of ramping the temperature down to below 600° C., such as about 500° C., is to maintain a hydride-terminated Si surface that suppresses the dewetting of the thin top Si layer because Si surface hydrides desorb at temperatures between about 550 and 600° C. depending on the ambient pressure. The chamber pressure may be between about 10 Torr (about 1.33 kPa) and about 760 Torr (about 101.32 kPa). The preferred pressure is about 760 Torr in order to suppress hydride depsorption. At a temperature below 600° C., the surface hydrides stabilize the surface and prevent dewetting so that a smooth and uniform top semiconductor, e.g., silicon, layer is present when the thickness is reduced to between about 0.5 nanometer and about 4 nanometers, as measured along the central axis 20, such as between about 0.5 nanometer and about 2 nanometers, as measured along the central axis, or between about 1 nanometer and about 2 nanometers, as measured along the central axis. The ultrathin silicon layer suffices as a relaxed silicon template for the epitaxial growth of silicon germanium. At thicknesses less than about 0.5 nanometers, the number of defects that occur in the subsequently deposited silicon germanium layer may be so high that the layer may be considered polycrystalline, rather than single crystalline. If the thickness of the silicon layer is greater than 4 nanometers, the silicon template may not be relaxed enough, thereby leading to a high density of threading dislocations.

III. Germanium Deposition and Anneal

Figure 2:
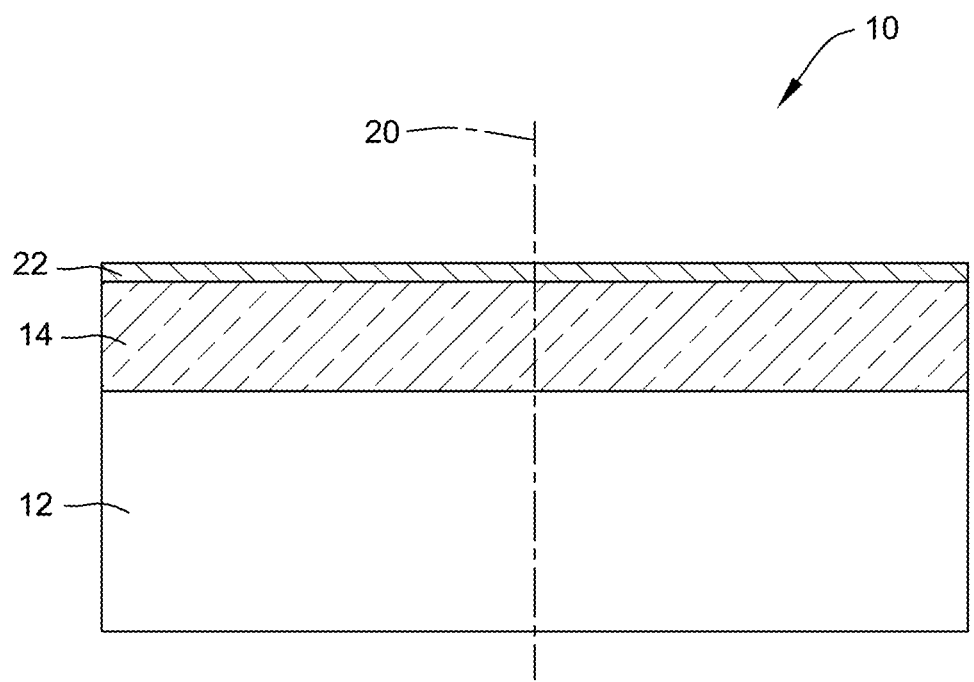
FIG. 2 is a depiction of a semiconductor-on-insulator (SOI, e.g., silicon-on-insulator) structure comprising a thinned device layer according to some embodiments of the present invention.
Figure 3:
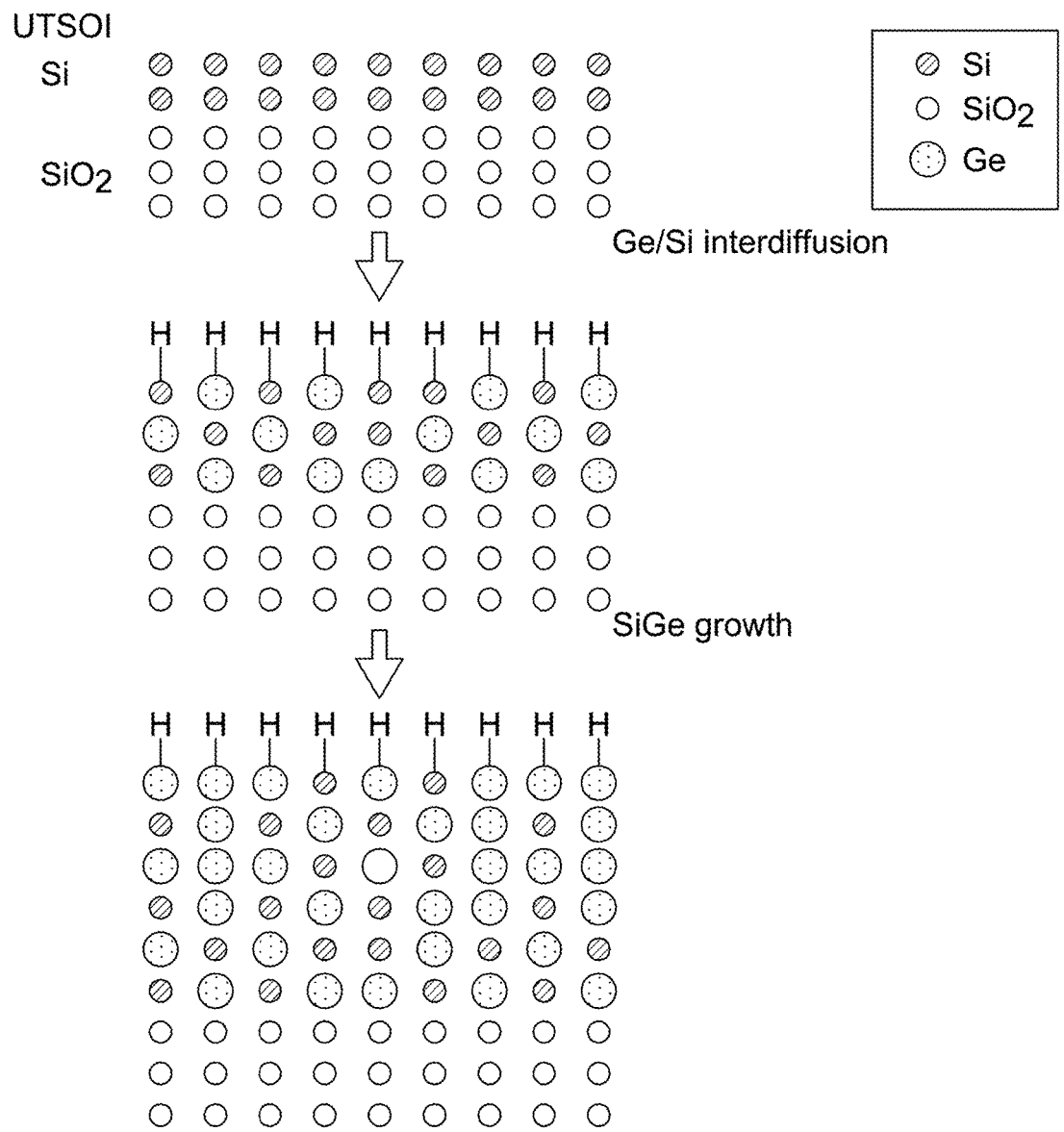
FIG. 3 is an illustration of the process of germanium deposition on a semiconductor-on-insulator (SOI, e.g., silicon-on-insulator) structure comprising a thinned device layer according to one embodiment of the method of the present invention.

According to some embodiments of the present invention, and with reference to FIGS. 2 and 3, germanium is deposited onto the thinned device layer 22, e.g., the thinned top silicon layer. Germanium is first deposited as a thin layer on the thinned top semiconductor, e.g., silicon, layer 22, and Ge subsequently interdiffused into the thinned top layer to form a uniformly distributed layer. To promote elastic strain relaxation via Si/Ge interdiffusion, two mechanisms are in play. The first is the surface energy minimization by the hydride-terminated growth front. Si—H has a higher bond strength compared to Ge—H, which thus minimizes the surface energy, which provides the driving force for Si updiffusion. Secondly, Ge down-diffusion is driven by the minimization of elastic energy. Both mechanisms promote the homogenization of the thin SiGe layer.

Germanium may be deposited in a layer having a deposited thickness between about 0.5 nanometer and about 4 nanometers, as measured along the central axis, such as between about 1 nanometer and about 2 nanometers, as measured along the central axis. The germanium layer may be deposited using vapor phase epitaxy (VPE), metalorganic chemical vapor deposition (MOCVD), chemical vapor deposition (CVD), low pressure chemical vapor deposition (LPCVD). The chamber for deposition of germanium may be the same chamber suitable for device layer thinning. Germanium may be deposited in a pulsed or continuous mode. Germanium may be deposited by epitaxial deposition using germanium precursors such as $GeH_4$, $Ge_2H_4$, $GeCl_4$, $GeCl_2$, $GeF_2$, $GeF_4$, $GeI_2$, $GeI_4$, and combinations thereof. In some preferred embodiments, germanium may be deposited by epitaxial deposition using germanium precursors selected from the group consisting of $GeH_4$, $Ge_2H_4$, or a combination thereof. The chamber ambient atmosphere may additionally comprise a carrier gas, which may be inert or it may be a reducing atmosphere. Suitable carrier gases include hydrogen, argon, helium, nitrogen, or any combination thereof. A preferred carrier gas is hydrogen. The germanium layer deposition temperature may be between about 300° C. and about 600° C., such as between about 400° C. and about 500° C. The chamber ambient pressure may be about atmospheric pressure.

In some embodiments of the present invention, after deposition of the germanium layer, the semiconductor-on-insulator (SOI, e.g., silicon-on-insulator) structure comprising a thinned device layer and having the germanium layer thereon is subjected to an anneal to thereby interdiffuse germanium atoms into the thinned device layer, thereby resulting in a uniform layer comprising semiconductor, e.g., silicon, and germanium. The anneal may accelerate interdiffusion of germanium to thereby yield a layer comprising silicon (from the thinned device layer) and germanium (from the germanium layer deposited in the previous step). The anneal may occur at a temperature between about 300° C. and about 600° C., such as between about 400° C. and about 500° C. The chamber ambient pressure may be about atmospheric pressure. The chamber ambient atmosphere during the anneal may comprise hydrogen. Hydrogen adsorbs onto the surface, which suppresses surface diffusion, thereby contributing to a smooth surface. Additionally, adsorbed hydride minimizes the surface energy by promoting silicon updiffusion and form Si—H bonds at the surface, which enhances interdiffusion of silicon and germanium.

The anneal duration may be between about 1 second and about 10 minutes, such as between about 10 seconds and about 60 seconds. In some embodiments, the layer comprising interdiffused silicon (from the thinned device layer) and germanium (from the germanium layer deposited in the previous step) may have a formula of $Si_xGe_{1-x}$, wherein x is between about 0.2 and about 0.8, molar ratio. In some embodiments, x may be between about 0.2 and about 0.4, molar ratio. The layer comprising interdiffused silicon (from the thinned device layer) and germanium (from the germanium layer deposited in the previous step) may have a thickness between about 0.5 nanometer and about 8 nanometers, as measured along the central axis, such as between about 1 nanometer and about 8 nanometers, as measured along the central axis, or between about 1 nanometer and about 4 nanometers, as measured along the central axis.

IV. Boron Deposition and Anneal

Figure 4:
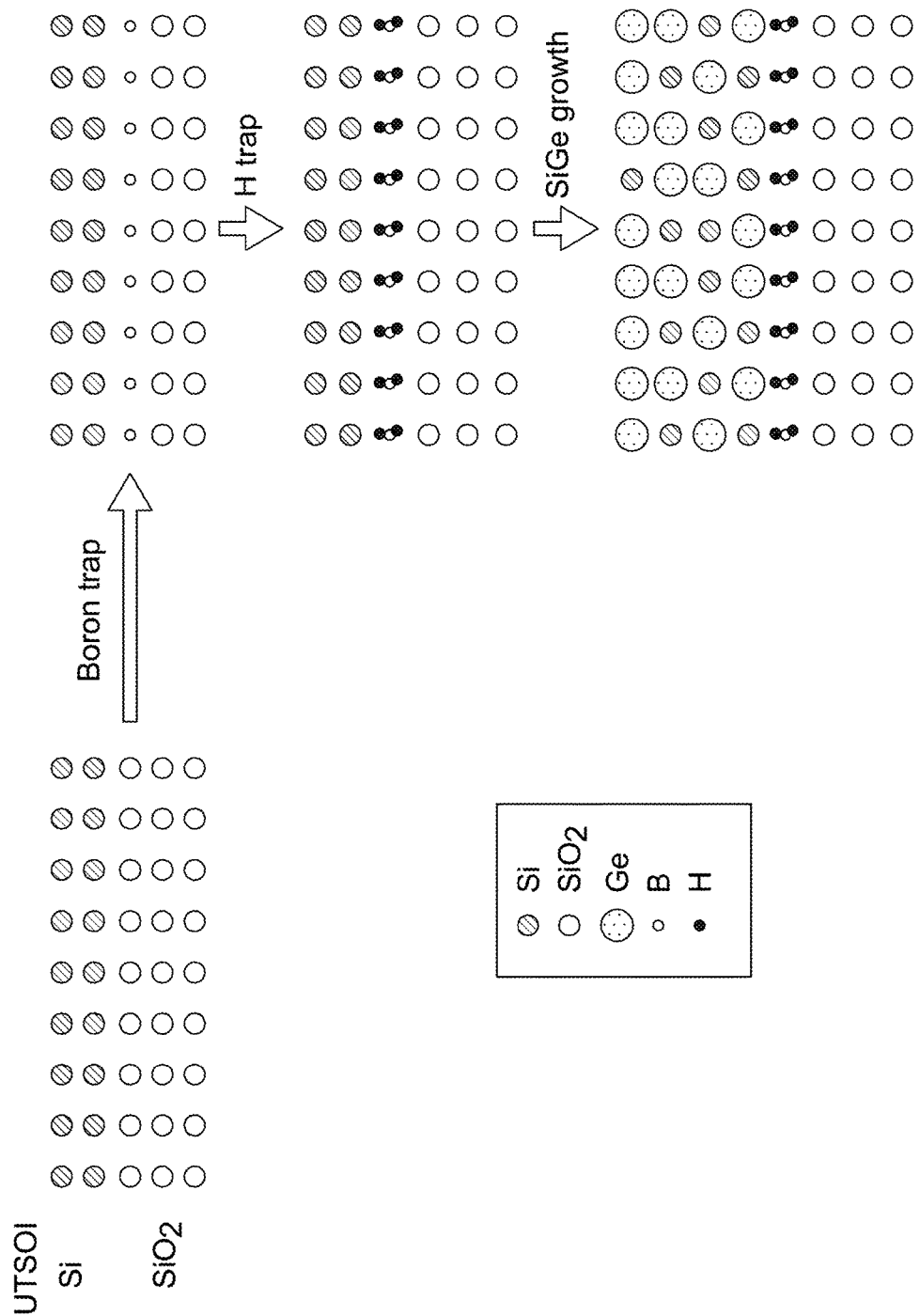
FIG. 4 is an illustration of the process of germanium deposition on a semiconductor-on-insulator (SOI, e.g., silicon-on-insulator) structure comprising a thinned device layer according to one embodiment of the method of the present invention.

According to some embodiments of the present invention, and with reference to FIG. 4, boron is deposited onto the thinned device layer 22, e.g., the thinned top silicon layer. Boron may be deposited in a layer having a deposited thickness between about 0.5 nanometer and about 4 nanometers, as measured along the central axis, such as between about 1 nanometer and about 2 nanometers, as measured along the central axis. Boron may be deposited using vapor phase epitaxy (VPE), metalorganic chemical vapor deposition (MOCVD), chemical vapor deposition (CVD), low pressure chemical vapor deposition (LPCVD). The chamber for deposition of boron may be the same chamber suitable for device layer thinning. Boron may deposited by epitaxial deposition using boron precursors selected from the group consisting of $B_2H_6$, trimethylboron ($B(CH_3)_3$), triethylboron ($B(CH_2CH_3)_3$), and combinations thereof. The chamber ambient atmosphere may additionally comprise a carrier gas, which may be inert or it may be a reducing atmosphere. Suitable carrier gases include hydrogen, argon, helium, nitrogen, or any combination thereof. A preferred carrier gas is hydrogen. Boron deposition temperature may be between about 300° C. and about 800° C., such as between about 400° C. and about 600° C. The chamber ambient pressure may be about atmospheric pressure.

In some embodiments, due to interfacial stress between the silicon device layer and the dielectric layer, boron atoms diffuse to the interface between the dielectric layer and the silicon layer as boron hydrides and get trapped there. Hydrides from the surface reaction also diffuse through the thinned device layer and bond with the trapped boron atoms at the interface between the dielectric layer and the silicon layer. The inserted boron atoms at the interface between the thinned semiconductor top layer, e.g., thinned silicon top layer, and the dielectric layer, e.g., buried oxide layer, significantly weakens the bond strength between the dielectric layer and the semiconductor top layer. The bonds at this interface are converted from chemical bonding to Van Der Waals bonding and the geometrical constraints of the thinned device layer are partially released, which thereby relieves stress in the final top layer.

V. Surfactant Atom Deposition and Anneal

In some embodiments, germanium and/or boron deposition as disclosed above may be combined with deposition of a surfactant atom, namely atoms that tend to segregate to the surface during growth. In some embodiments, a surfactant atom may be deposited onto the thinned device layer 22. The surfactant atom may be selected from the group consisting of arsenic, antimony, tellurium, and any combination thereof. The surfactant atom may be deposited in a layer having a deposited thickness between about 0.5 nanometer and about 4 nanometers, as measured along the central axis, such as between about 1 nanometer and about 2 nanometers, as measured along the central axis. The surfactant atom may be deposited using vapor phase epitaxy (VPE), metalorganic chemical vapor deposition (MOCVD), chemical vapor deposition (CVD), or low pressure chemical vapor deposition (LPCVD). The chamber for deposition of boron may be the same chamber suitable for device layer thinning. Arsenic may deposited by chemical vapor deposition using arsenic precursors selected from the group consisting of $AsH_3$, trimethylarsine, tributylarsine, and combinations thereof. Antimony may deposited by chemical vapor deposition using antimony precursors selected from the group consisting of trimethylantimony, triethylantimony, and a combination thereof. Tellurium may deposited by chemical vapor deposition using tellurium precursors such as dimethyltelluride. The chamber ambient atmosphere may additionally comprise a carrier gas, which may be inert or it may be a reducing atmosphere. Suitable carrier gases include hydrogen, argon, helium, nitrogen, or any combination thereof. A preferred carrier gas is hydrogen. Surfactant atom deposition temperature may be less than about 600° C., such as less than about 450° C. The chamber ambient pressure may be about atmospheric pressure. The surfactant atoms tend to migrate to the growth front and suppress surface diffusion, which enables the growth of a thicker strained Ge layer (>1 nm). The strain energy associated with the thicker strained Ge promotes interdiffusion between silicon and germanium, thereby enhancing the uniformity of the SiGe layer.

In some embodiments, at the completion of the silicon etching/silicon germanium growth (deposition) cycle, the temperature of the substrate can be ramped to >600° C. to sublimate the n-type surfactant (e.g., Sb, As) to prevent additional doping of the SiGe layer.

VI. Deposition of Silicon Germanium Layer

After the deposition of the thin germanium layer and subsequent interdiffusion, deposition of boron, or deposition of surfactant atom, or any combination of these steps, a layer comprising silicon and germanium is deposited upon the SOI substrate. See also FIGS. 3 and 4. The layer comprising silicon and germanium has a formula $Si_yGe_{1-y}$, wherein y is between about 0.0 and about 0.9, molar ratio, or between about 0.2 and about 0.9, or between about 0.2 and about 0.4, or between about 0.3 and about 0.9. The layer comprising silicon and germanium may be deposited using vapor phase epitaxy (VPE), metalorganic chemical vapor deposition (MOCVD), physical vapor deposition (PVD), chemical vapor deposition (CVD), low pressure chemical vapor deposition (LPCVD), plasma enhanced chemical vapor deposition (PECVD), or molecular beam epitaxy (MBE). Silicon precursors for CVD include methyl silane, silicon tetrahydride (silane), trisilane, disilane, pentasilane, neopentasilane, tetrasilane, dichlorosilane ($SiH_2Cl_2$), trichlorosilane ($SiHCl_3$), silicon tetrachloride ($SiCl_4$), among others. In some preferred embodiments, the silicon precursor is selected from among silane, dichlorosilane ($SiH_2Cl_2$), and trichlorosilane ($SiHCl_3$). Germanium may be deposited by epitaxial deposition using germanium precursors such as $GeH_4$, $Ge_2H_4$, $GeCl_4$, $GeCl_2$, $GeF_2$, $GeF_4$, $GeI_2$, $GeI_4$, and combinations thereof. In some embodiments, germanium may deposited by epitaxial deposition using germanium precursors selected from the group consisting of $GeH_4$, $Ge_2H_4$, $GeCl_4$, and any combination thereof. The chamber ambient atmosphere may additionally comprise a carrier gas, which may be inert or it may be a reducing atmosphere. Suitable carrier gases include hydrogen, argon, helium, nitrogen, or any combination thereof. A preferred carrier gas is hydrogen. The germanium layer deposition temperature may be between about 300° C. and about 600° C., such as between about 400° C. and about 500° C. The chamber ambient pressure may be between about 10 Torr (about 1.33 kPa) and about 760 Torr (about 101.32 kPa).

In some embodiments, the layer comprising silicon and germanium has a thickness between about 2 nanometers and about 5000 nanometers, as measured along the central axis. In some embodiments, the thickness may be between about 2 nanometers and about 500 nanometers, as measured along the central axis, between about 2 nanometers and about 100 nanometers, as measured along the central axis, such as between about 4 nanometers and about 40 nanometers, as measured along the central axis.

VII. Deposition of Silicon Passivation Layer

In some embodiments, after deposition of any or all of the layers disclosed above, a passivation layer comprising silicon may be deposited upon the SOI substrate. The passivation layer comprising silicon may be deposited using vapor phase epitaxy (VPE), metalorganic chemical vapor deposition (MOCVD), physical vapor deposition (PVD), chemical vapor deposition (CVD), low pressure chemical vapor deposition (LPCVD), plasma enhanced chemical vapor deposition (PECVD), or molecular beam epitaxy (MBE). Silicon precursors for CVD include methyl silane, silicon tetrahydride (silane), trisilane, disilane, pentasilane, neopentasilane, tetrasilane, dichlorosilane ($SiH_2Cl_2$), trichlorosilane ($SiHCl_3$), silicon tetrachloride ($SiCl_4$), among others. In some preferred embodiments, the silicon precursor is selected from among silane, dichlorosilane ($SiH_2Cl_2$), and trichlorosilane ($SiHCl_3$). The chamber ambient atmosphere may additionally comprise a carrier gas, which may be inert or it may be a reducing atmosphere. Suitable carrier gases include hydrogen, argon, helium, nitrogen, or any combination thereof. A preferred carrier gas is hydrogen. The passivation layer deposition temperature may be between about 300° C. and about 600° C., such as between about 400° C. and about 500° C. The chamber ambient pressure may be between about 10 Torr (about 1.33 kPa) and about 760 Torr (about 101.32 kPa).

In some embodiments, the passivation layer comprising silicon has a thickness between about 0.1 nanometer and about 4 nanometers, as measured along the central axis. In some embodiments, the thickness may be between about 0.5 nanometer and about 2 nanometers, as measured along the central axis.

In the final SGOI structure according to the present invention, the silicon germanium layer having the structure of $Si_xGe_{1-x}$ (x=0-0.9) may have a threading dislocation density of less than $1 \times 10^6/cm^2$. Additionally, the surface roughness using RMS (root mean square) is less than 5 angstroms.

Having described the invention in detail, it will be apparent that modifications and variations are possible without departing from the scope of the invention defined in the appended claims.

EXAMPLES

The following non-limiting examples are provided to further illustrate the present invention.

Example 1. Silicon Germanium Deposition

In one example, a silicon-on-insulator substrate is provided with a top silicon device layer thickness of between about 5 and about 10 nanometers. The top silicon device layer is etched to a thickness between about 1 and about 2 nanometers using HCl vapor phase etch in an epitaxial reactor. The etch temperature starts with 800° C. and then is ramped down to 500° C. The chamber ambient is $H_2$ at a pressure between 10 to 760 Torr. At a temperature below 600° C., the surface hydrides stabilize the top silicon surface and prevent dewetting so that a smooth and uniform silicon layer is present when the thickness is reduced to 1-2 nm range.

Following the Si etch, a thin germanium layer of 1-2 nm is grown on top of the silicon surface. The desired germanium growth temperature is between 400° C. and 500° C. at atmospheric pressure in $H_2$ ambient. Germanium growth may be performed in a continuous or pulse-and-pause mode. $GeH_4$ or $Ge_2H_4$ is used as the germanium precursor. After the growth of 1-2 nm germanium layer, an optional soak step at 400-500° C. for 10 s to 60 s may be applied to further promote the interdiffusion of Si and Ge. A subsequent $Si_{1-x}Ge_x$ (x=0.3-0.9 molar ratio) layer with the target thickness, 2-100 nm, is grown at 400-600° C. to complete the SGOI substrate. An optional Si passivation layer of 0.5-2 nm may be grown on top of the SGOI surface for device fabrication.

Example 2. Boron Deposition

In one example, a silicon-on-insulator substrate is provided with a top silicon device layer thickness of between about 5 and about 10 nanometers. The top silicon device layer is etched to a thickness between about 1 and about 2 nanometers using HCl vapor phase etch in an epitaxial reactor. The etch temperature starts with 800° C. and then is ramped down to 500° C. The chamber ambient is $H_2$ at a pressure between 10 to 760 Torr. At a temperature below 600° C., the surface hydrides stabilize the Si surface and prevent dewetting so that a smooth and uniform Si layer is present when the thickness is reduced to 1-2 nm range.

Then, diborane ($B_2H_6$) is introduced to the Si surface at 400-600° C. at atmospherice pressure so that a Boron layer is deposited on it. Due to the stress at the interface of the silicon layer and buried oxide layers, B atoms diffuse across the top silicon layer and get trapped at the interface. Hydrides form the surface reaction also diffuse through the top silicon layer and bond with the trapped B atoms at the interface of the silicon layer and buried oxide layers. The inserted boron layer at the interface significantly weakens the Si/BOX bond strength. The Si/BOX bonds are converted from chemical bonding to Van Der Waals bonding and the geometrical constraints of the Si layer is partially released.

A subsequent $Si_{1-x}Ge_x$ (x=0.3-0.9 molar ratio) layer with the target thickness, 2-100 nm, is grown at 400-600° C. to complete the SGOI substrate. An optional Si passivation layer of 0.5-2 nm may be grown on top of the SGOI surface for device fabrication. As a result, the lattice mismatch induced strain is relaxed by elastic relaxation rather than plastic deformation, preventing the formation of dislocations. This relaxation mechanism is fundamental to manufacturing device-quality SiGe device layers. After SiGe growth, an optional Si passivation layer of 0.5-2 nm may be grown on top of the SGOI surface for device fabrication.

Example 3. Surfactant Atom Deposition

In one example, a silicon-on-insulator substrate is provided with a top silicon device layer thickness of between about 5 and about 10 nanometers. The top silicon device layer is etched to a thickness between about 1 and about 2 nanometers using HCl vapor phase etch in an epitaxial reactor. The etch temperature starts with 800° C. and then is ramped down to 500° C. The chamber ambient is $H_2$ at a pressure between 10 to 760 Torr. At a temperature below 600° C., the surface hydrides stabilize the Si surface and prevent dewetting so that a smooth and uniform Si layer is present when the thickness is reduced to 1-2 nm range.

Then surfactant atoms, such as As, Sb, or Te are introduced to the Si surface at 450 C or below followed by Ge growth in $H_2$ ambient. The surfactant atoms tend to migrate to the growth front and suppress surface diffusion, which enables the growth of a thicker strained Ge layer (>1 nm). The strain energy associated with the thicker strained Ge promotes the Si—Ge interdiffusion.

A subsequent $Si_{1-x}Ge_x$ (x=0.3-0.9 molar ratio) layer with the target thickness, 2-100 nm, is grown at 400-600° C. to complete the SGOI substrate. An optional Si passivation layer of 0.5-2 nm may be grown on top of the SGOI surface for device fabrication. As a result, the lattice mismatch induced strain is relaxed by elastic relaxation rather than plastic deformation, preventing the formation of dislocations. This relaxation mechanism is fundamental to manufacturing device-quality SiGe device layers. After SiGe growth, an optional Si passivation layer of 0.5-2 nm may be grown on top of the SGOI surface for device fabrication.

As various changes could be made in the above compositions and processes without departing from the scope of the invention, it is intended that all matter contained in the above description be interpreted as illustrative and not in a limiting sense.

When introducing elements of the present invention or the preferred embodiment(s) thereof, the articles "a," "an," "the," and "said" are intended to mean that there are one or more of the elements. The terms "comprising," "including," and "having" are intended to be inclusive and mean that there may be additional elements other than the listed elements.

What is claimed is:

1. A method of preparing a multilayer structure, the method comprising:
    etching a silicon layer of a silicon-on-insulator substrate in an ambient atmosphere comprising hydrogen chloride vapor, chloride vapor, or a combination thereof, wherein the silicon-on-insulator substrate comprises (i) a single crystal semiconductor handle layer comprising two major, generally parallel surfaces, one of which is a front surface of the single crystal semiconductor handle layer and the other of which is a back surface of the single crystal semiconductor handle layer, a circumferential edge joining the front and back surfaces of the single crystal semiconductor handle layer, a central plane between and parallel to the front surface and the back surface of the single crystal semiconductor handle layer, a central axis perpendicular to the central plane, and a bulk region between the front and back surfaces of the single crystal semiconductor handle layer, (ii) a dielectric layer in interfacial contact with the front surface of the single crystal semiconductor handle layer, and (ii) the silicon layer in interfacial contact with the dielectric layer, and further wherein the silicon layer is etched to a thickness between about 0.5 nanometer and about 4 nanometers, as measured along the central axis, and further wherein the etched silicon layer comprises a hydride-terminated surface;
    depositing a first layer comprising germanium on the etched silicon layer;

annealing the silicon-on-insulator substrate comprising the etched silicon layer and the first layer comprising germanium at a temperature and duration sufficient to interdiffuse germanium from the first layer into the etched silicon layer, to thereby yield a second layer comprising silicon and germanium having a formula of $Si_xGe_{1-x}$, wherein x is between about 0.2 and about 0.8, molar ratio; and depositing a third layer comprising silicon and germanium by epitaxial deposition on the second layer comprising silicon and germanium, wherein the third layer comprising silicon and germanium has a formula $Si_yGe_{1-y}$, wherein y is between about 0 and about 0.9, molar ratio.

2. The method of claim 1 wherein each step is carried out in one reaction chamber.

3. The method of claim 1 wherein the silicon layer is etched to a thickness between about 0.5 nanometer and about 2 nanometers, as measured along the central axis.

4. The method of claim 1 wherein the silicon layer is etched to a thickness between about 1 nanometer and about 2 nanometers, as measured along the central axis.

5. The method of claim 1 wherein the silicon layer is etched at an initial temperature of about 800° C. or more, and further wherein the etching temperature is decreased to about 500° C. during the silicon layer etching step.

6. The method of claim 1 wherein the first layer comprising germanium has a deposited thickness between about 0.5 nanometer and about 4 nanometers, as measured along the central axis.

7. The method of claim 1 wherein the first layer comprising germanium has a deposited thickness between about 1 nanometer and about 2 nanometers, as measured along the central axis.

8. The method of claim 1 wherein the first layer comprising germanium is deposited using germanium precursors selected from the group consisting of $GeH_4$, $Ge_2H_4$, $GeCl_4$, $GeCl_2$, $GeF_2$, $GeF_4$, $GeI_2$, $GeI_4$, and any combination thereof.

9. The method of claim 1 wherein the second layer comprising silicon and germanium has a thickness between about 1 nanometer and about 8 nanometers, as measured along the central axis.

10. The method of claim 1 wherein the annealing is at a temperature and duration sufficient to consume the entire first layer comprising germanium into the second layer comprising silicon and germanium.

11. The method of claim 1 wherein the third layer comprising silicon and germanium has a formula $Si_yGe_{1-y}$, wherein y is between about 0.2 and about 0.4, molar ratio.

12. The method of claim 1 wherein the third layer comprising silicon and germanium has a formula $Si_yGe_{1-y}$, wherein y is between about 0.3 and about 0.9, molar ratio.

13. The method of claim 1 wherein the third layer comprising silicon and germanium has a thickness between about 2 nanometers and about 5000 nanometers, as measured along the central axis.

14. The method of claim 1 wherein the third layer comprising silicon and germanium has a thickness between about 2 nanometers and about 500 nanometers, as measured along the central axis.

15. The method of claim 1 wherein the third layer comprising silicon and germanium has a thickness between about 2 nanometers and about 100 nanometers, as measured along the central axis.

16. The method of claim 1 wherein the third layer comprising silicon and germanium has a thickness between about 4 nanometers and about 40 nanometers, as measured along the central axis.

17. The method of claim 1 wherein a surfactant atom selected from the group consisting of arsenic, antimony, tellurium, and any combination thereof is deposited before the first layer comprising germanium is deposited on the etched silicon layer.

18. The method of claim 1 further comprising:
depositing a fourth layer comprising silicon on the third layer comprising silicon and germanium.

19. The method of claim 1 wherein the ambient atmosphere comprising hydrogen chloride vapor, chloride vapor, or a combination thereof further comprises hydrogen.

20. The method of claim 17 wherein the first layer comprising germanium has a thickness between about 1 nanometer and about 4 nanometers, as measured along the central axis.

21. The method of claim 18 wherein the fourth layer comprising silicon is between about 0.1 nanometer and about 4 nanometers thick, as measured along the central axis.

22. The method of claim 18 wherein the fourth layer comprising silicon is between about 0.5 nanometer and about 2 nanometers thick, as measured along the central axis.

23. A method of preparing a multilayer structure, the method comprising:
etching a silicon layer of a silicon-on-insulator substrate in an ambient atmosphere comprising hydrogen chloride vapor, chloride vapor, or a combination thereof, wherein the silicon-on-insulator substrate comprises (i) a single crystal semiconductor handle layer comprising two major, generally parallel surfaces, one of which is a front surface of the single crystal semiconductor handle layer and the other of which is a back surface of the single crystal semiconductor handle layer, a circumferential edge joining the front and back surfaces of the single crystal semiconductor handle layer, a central plane between and parallel to the front surface and the back surface of the single crystal semiconductor handle layer, a central axis perpendicular to the central plane, and a bulk region between the front and back surfaces of the single crystal semiconductor handle layer, (ii) a dielectric layer in interfacial contact with the front surface of the single crystal semiconductor handle layer, and (ii) the silicon layer in interfacial contact with the dielectric layer, and further wherein the silicon layer is etched to a thickness between about 0.5 nanometer and about 4 nanometers, as measured along the central axis, and further wherein the etched silicon layer comprises a hydride-terminated surface;

depositing boron on the etched silicon layer at a temperature and for a duration sufficient to cause boron atoms to diffuse to the interface between the dielectric layer and the silicon layer; and depositing a layer comprising silicon and germanium by epitaxial deposition on the etched silicon layer.

24. The method of claim 23 wherein each step is carried out in one reaction chamber.

25. The method of claim 23 wherein the silicon layer is etched to a thickness between about 0.5 nanometer and about 2 nanometers, as measured along the central axis.

26. The method of claim 23 wherein the silicon layer is etched to a thickness between about 1 nanometer and about 2 nanometers, as measured along the central axis.

27. The method of claim 23 wherein the silicon layer is etched at an initial temperature of about 800° C. or more, and further wherein the etching temperature is decreased to about 500° C. during the silicon layer etching step.

28. The method of claim 23 wherein boron is deposited from a boron precursor selected from the group consisting of $B_2H_6$, trimethylboron, triethylboron, and any combination thereof.

29. The method of claim 23 wherein boron atoms diffuse to the interface between the dielectric layer and the silicon layer as boron hydrides.

30. The method of claim 23 wherein the layer comprising silicon and germanium has a formula $Si_yGe_{1-y}$, wherein y is between about 0 and about 0.9, molar ratio.

31. The method of claim 23 wherein the layer comprising silicon and germanium has a formula $Si_yGe_{1-y}$, wherein y is between about 0.2 and about 0.9, molar ratio.

32. The method of claim 23 wherein the layer comprising silicon and germanium has a formula $Si_yGe_{1-y}$, wherein y is between about 0.2 and about 0.4, molar ratio.

33. The method of claim 23 wherein the layer comprising silicon and germanium has a formula $Si_yGe_{1-y}$, wherein y is between about 0.3 and about 0.9, molar ratio.

34. The method of claim 23 further comprising:
depositing a layer comprising silicon on the layer comprising silicon and germanium.

35. The method of claim 23 wherein the ambient atmosphere comprising hydrogen chloride vapor, chloride vapor, or a combination thereof further comprises hydrogen.

36. The method of claim 34 wherein the layer comprising silicon is between about 0.1 nanometer and about 4 nanometers thick, as measured along the central axis.

37. The method of claim 34 wherein the layer comprising silicon is between about 0.5 nanometer and about 2 nanometers thick, as measured along the central axis.

* * * * *